(12) United States Patent
Poveda Lerma et al.

(10) Patent No.: US 11,552,577 B2
(45) Date of Patent: Jan. 10, 2023

(54) MODULAR PHOTOVOLTAIC SOLAR INVERTER

(71) Applicant: Power Electronics España, S.L., Valencia (ES)

(72) Inventors: Antonio Poveda Lerma, Valencia (ES); Abelardo Salvo Lillo, Valencia (ES); David Salvo Lillo, Valencia (ES)

(73) Assignee: Power Electronics España, S.L., Valencia (ES)

( * ) Notice: Subject to any disclaimer, the term of this patent is extended or adjusted under 35 U.S.C. 154(b) by 28 days.

(21) Appl. No.: 17/053,560

(22) PCT Filed: May 9, 2019

(86) PCT No.: PCT/ES2019/070308
§ 371 (c)(1),
(2) Date: Nov. 6, 2020

(87) PCT Pub. No.: WO2019/215372
PCT Pub. Date: Nov. 14, 2019

(65) Prior Publication Data
US 2021/0234468 A1    Jul. 29, 2021

(30) Foreign Application Priority Data
May 9, 2018    (ES) .................. P201830455

(51) Int. Cl.
*H02M 7/00*   (2006.01)
*H05K 5/02*   (2006.01)
*H05K 7/20*   (2006.01)

(52) U.S. Cl.
CPC .......... *H02M 7/003* (2013.01); *H05K 5/0217* (2013.01); *H05K 7/20172* (2013.01); *H05K 7/20909* (2013.01)

(58) Field of Classification Search
None
See application file for complete search history.

(56) References Cited

U.S. PATENT DOCUMENTS

| | | | |
|---|---|---|---|
| 8,537,585 B2 * | 9/2013 | Ku | H02M 7/48 363/17 |
| 9,762,134 B2 * | 9/2017 | Deboy | H02M 3/33592 |
| 10,199,160 B2 * | 2/2019 | Lestoquoy | H02J 50/12 |
| 2014/0036563 A1 * | 2/2014 | Chapman | H02J 3/383 363/131 |

(Continued)

FOREIGN PATENT DOCUMENTS

| CN | 104578735 A | 4/2015 |
|---|---|---|
| EP | 2575229 A2 | 4/2013 |

(Continued)

*Primary Examiner* — Courtney L Smith
(74) *Attorney, Agent, or Firm* — The Webb Law Firm

(57) ABSTRACT

The present invention relates to a modular solar photovoltaic inverter where by reducing the size of the filtering module and reducing the number of components, it reduces the size of the solar inverter compared to the state of the art; and with the configuration of the power modules, it generates channels that allow the passage of air from the cooling module, obtaining a modular photovoltaic solar inverter that improves the dimensions, weight, maintenance, cooling and safety with respect to those known up until now.

1 Claim, 7 Drawing Sheets

(56) References Cited

U.S. PATENT DOCUMENTS

| | | | | |
|---|---|---|---|---|
| 2015/0144176 A1* | 5/2015 | Chang | ..................... | H02J 3/385 |
| | | | | 136/244 |
| 2018/0076626 A1* | 3/2018 | Gudgel | ............... | H02J 13/0096 |
| 2018/0309381 A1* | 10/2018 | Chapman | ................ | H02J 3/383 |
| 2020/0153271 A1* | 5/2020 | Poveda Lerma | ....... | H02J 3/388 |
| 2020/0177080 A1* | 6/2020 | Mizokami | ............... | H02M 7/48 |
| 2020/0328670 A1* | 10/2020 | Poveda Lerma | ..... | H02M 3/158 |
| 2021/0111623 A1* | 4/2021 | Poveda Lerma | ... | H02M 7/5395 |

FOREIGN PATENT DOCUMENTS

| | | |
|---|---|---|
| GB | 2500196 A | 9/2013 |
| WO | 2014004961 A1 | 1/2014 |

\* cited by examiner

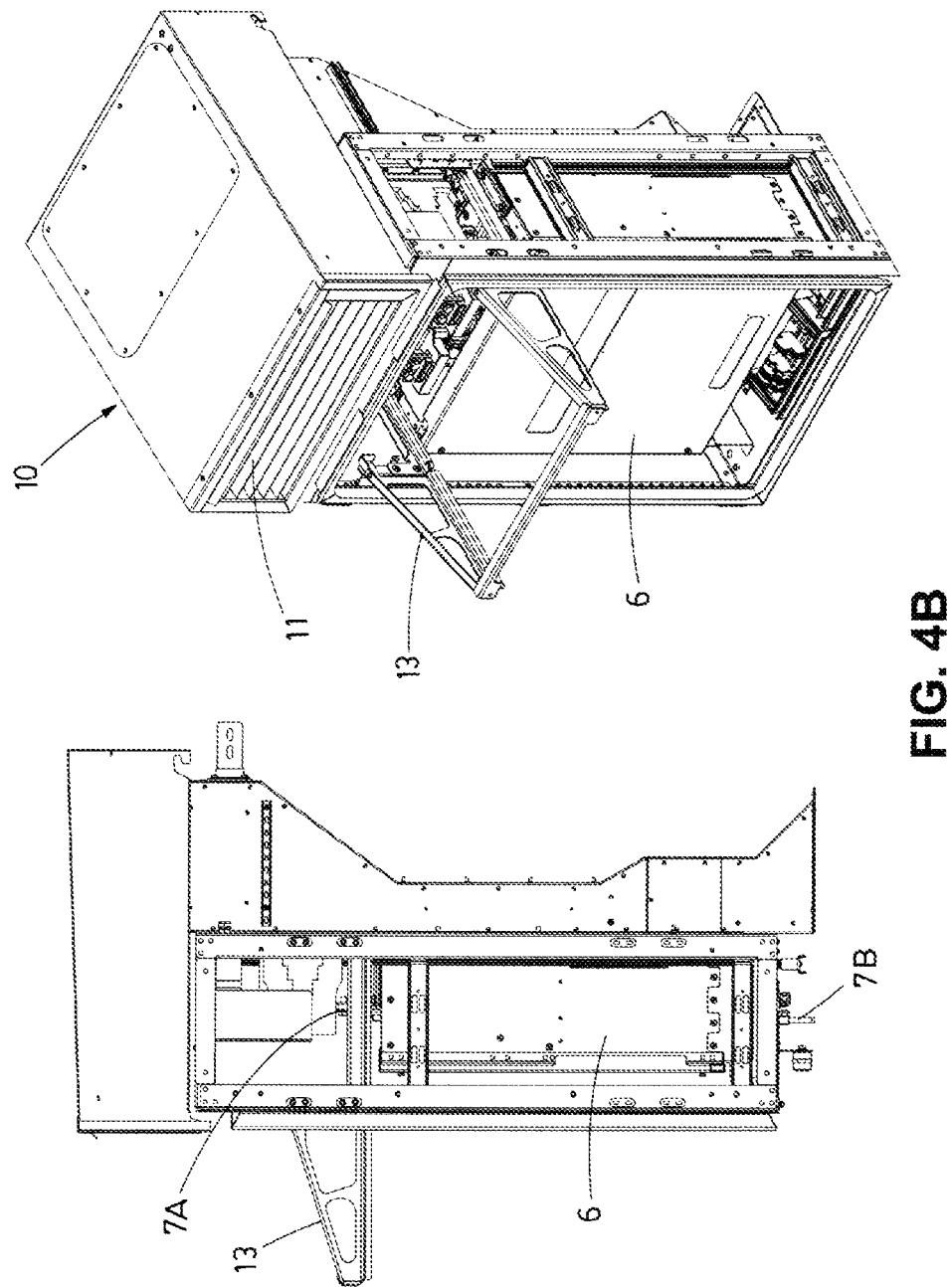

MODULAR PHOTOVOLTAIC SOLAR INVERTER

CROSS-REFERENCE TO RELATED APPLICATIONS

This application is the United States national phase of International Application No. PCT/ES2019/070308 filed May 9, 2019, and claims priority to Spanish Patent Application No. P201830455 filed May 9, 2018, the disclosures of which are hereby incorporated by reference in their entirety.

BACKGROUND OF THE INVENTION

Field of the Invention

The object of the present invention is a modular photovoltaic solar inverter wherein its improved topology reduces the dimensions, weight and maintenance cost, and improves its safety and cooling system in comparison with the topologies known up until now.

Description of Related Art

Currently, the so-called photovoltaic inverters have at least one module that converts direct current (DC) that comes from photovoltaic panels to alternating current (AC).

Each of the photovoltaic solar inverter modules comprises a power cell, which in turn generally comprises a capacitor bus, a converter bridge and a sinusoidal filter, which connects the equipment to the network and reduces the high frequency harmonics. These sinusoidal filters provide a sinusoidal voltage with the same characteristics as the network, and also provide harmonic filtering and low distortion of the network current. The most used sinusoidal filters are LCL type filters, the main advantage of which compared to L type filters is that they can achieve a higher filtration quality with a lower equivalent inductance.

The inductances of the LCL filter are the components that occupy the most physical space of the photovoltaic inverter and that substantially increase the weight of the module and the equipment. As a guideline, an inductance of a LCL filter has the dimensions and weight indicated below: a width of 640 mm, a depth of 400 mm, a height of 800 mm, and a weight of 525 kg.

In the current state of the art, modular photovoltaic inverters implement as many filters as modules. Taking this fact into account, the indicative dimensions of a common 6-module solar inverter would be the following: a width of 5,175 mm, a depth of 945 mm, a height of 2,200 mm, and a weight of 4,600 kg.

In order to solve these problems, different topologies of power converters have been studied, for example document WO2014004961A1 describes a modular system configured to be connected to an AC network. This system comprises a DC/DC converter linked to each PV string or set of photovoltaic cells, a DC bus, two inverters for each DC/DC converter connected to the DC bus and to the DC converter and a frequency transformer linked to the network. More specifically, the conversion topology of this document is based on linking each two inverters in a group, so that one of the inverters of the group is linked to the network by a star-triangle transformer and the other inverter by means of a triangle-triangle transformer. In this way the harmonics are eliminated and it is not necessary to use a filter since the transformer would perform the filtering tasks.

Despite this, these systems still have a large size and are difficult to configure because they incorporate frequency transformers that increase the dimensions and weight of the inverter and present difficulties in carrying out installation and maintenance tasks. In addition, if these devices are not properly cooled, they can have a greater number of failures due to overheating and a lower conversion efficiency. Moreover, due to its large size and complexity, the maintenance tasks have to be done "in-situ" by specialized technicians, which entails stops in the generation and therefore a great loss of energy generated by the photovoltaic panels.

Additionally, these current systems have a low voltage output and due to this, when they are used in large installations that are usually located in remote places and that therefore need medium voltage output, they require the additional use of an average voltage transformer with its respective associated medium voltage cabinet.

This medium voltage transformer increases the size and complexity of the assembly installation. As an example, an assembly of a 6-module inverter and a transformer has indicative dimensions of 690 mm long, 2,340 mm high and 2,235 mm wide, with an approximate weight of 6 tm.

The present invention solves all the above drawbacks.

SUMMARY OF THE INVENTION

The present invention describes a modular photovoltaic solar inverter comprising:
  a plurality of power modules that convert a direct current (DC) to an alternating current (AC),
  a DC bus that connects all the inputs of the power modules to a photovoltaic field through a connection/disconnection device, where each power module in turn comprises a power cell and a filtering module linked to an output of the power cell to adapt the electrical characteristics of the alternating current (AC),
  an alternating current (AC) bus that connects the output of each power module to the electrical network,
  wherein:
    the power modules are configured forming groups of two power modules facing each other, and each group of two power modules is linked in parallel to the other groups of two power modules.

Optionally, the modular photovoltaic solar inverter further comprises a transformer module arranged between the alternating current (AC) bus and the electrical network.

Optionally, the modular photovoltaic solar inverter further comprises a cooling module configured to reduce the temperature of at least the power modules and/or the transformer module.

Optionally, the modular photovoltaic solar inverter further comprises a container where at least the power modules, the filtering modules, the transformer module and the cooling module are integrated.

Preferably, the container comprises a first and a second sealed compartment separating at least the power modules from the transformer module, and is configured to protect the modules from rain and to allow temporary access to the modules by means of a plurality of doors.

Preferably, the cooling module comprises first and second independent ventilation circuits respectively arranged in the first and the second sealed compartment.

More specifically, each ventilation circuit comprises:
  a centrifugal fan configured to drive pre-filtered air from the base of the container,
  at least one channel, installed in the base of the compartment and linked to the centrifugal fan thereof, extraction slots, installed in the roof of the compartment that enable the pre-filtered air to circulate from the base of the compartment to the outside and cool at least the power modules and the transformer module.

Optionally, when the electrical network has a medium voltage, the transformer module of the modular photovoltaic solar inverter is a medium voltage transformer module connected between the alternating current (AC) bus and the electrical network, wherein the transformer module comprises an output that is configured to connect to the medium voltage electrical network.

Preferably, the filtering module is an LLC filter. More specifically, the LLC filter comprises:
- a first inductance for each output phase of each power module, wherein the first inductances of each group of two power modules are coupled together in the respective phases thereof,
- a capacitor connected in parallel to the first inductances, and
- a second inductance linked in series to the capacitor.

Additionally, the photovoltaic solar inverter comprises an extraction module that can be coupled to a frame of at least one of the doors of the container that provides access to one of the power modules, wherein the extraction module is configured so that a single operator can extract and replace the entire power module when it is damaged.

In this way, the present invention, by reducing the size of the filtering module and reducing the number of components, reduces the size of the solar inverter compared with the state of the art; and with the configuration of the power modules, it generates channels that enable the passage of air from the cooling module, obtaining a modular photovoltaic solar inverter that improves the dimensions, weight, maintenance, cooling and safety with respect to those known up until now.

BRIEF DESCRIPTION OF THE DRAWINGS

To complement the description that is being made and for the purpose of helping to better understand the features of the invention according to a preferred practical embodiment thereof, in which a set of drawings depicting the following in an illustrative and non-limiting manner is attached as an integral part of said description:

FIGS. 4A, 4B, 4C and 4D all show perspective views of the extraction module being extracted from the modular photovoltaic solar inverter of the present invention in two stages of said extraction.

DETAILED DESCRIPTION OF THE INVENTION

Figure 1:
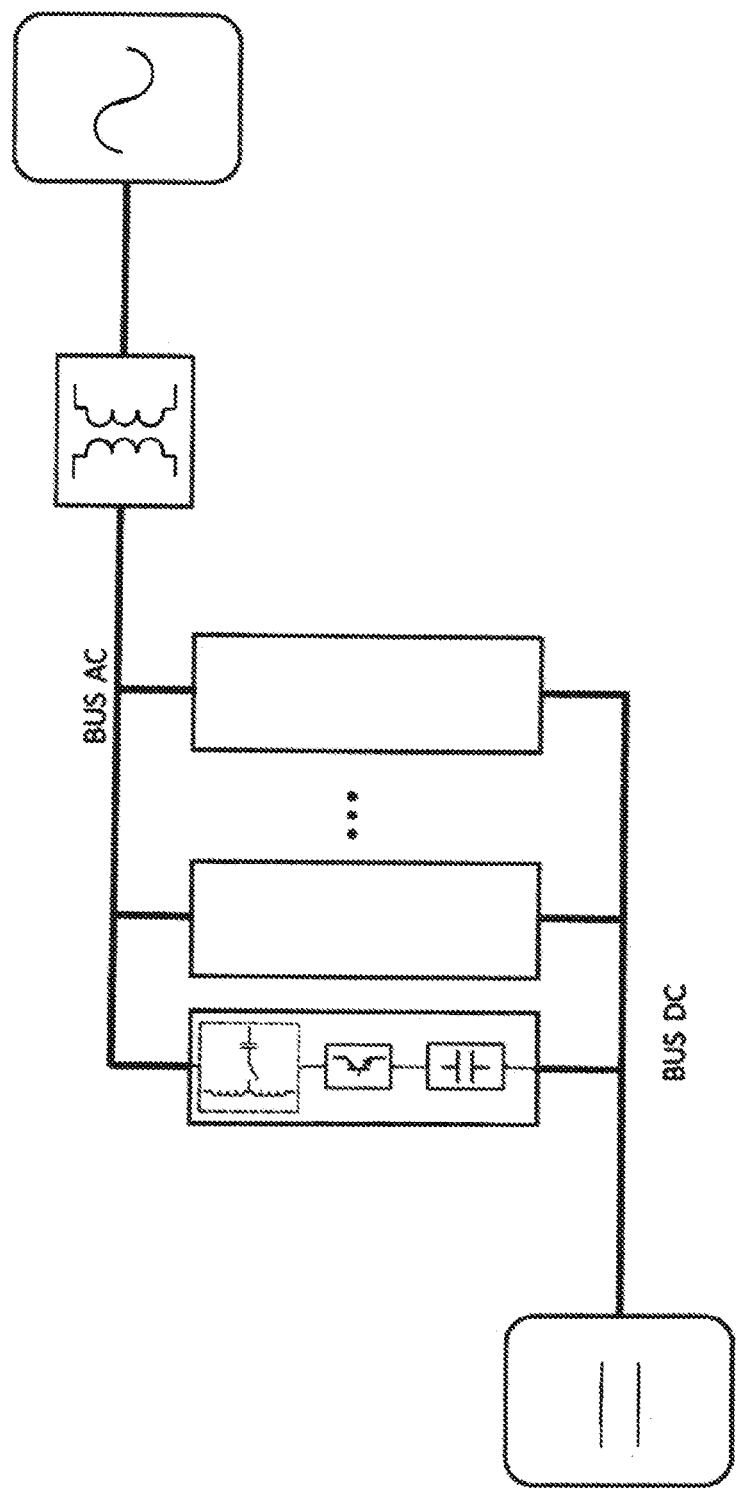
FIG. 1 shows a schematic view of a solar inverter according to the state of the art.

In a preferred embodiment, as shown in FIGS. 2, 4A, 4B, 4C and 4D, the modular photovoltaic solar inverter (1) is arranged in a container (10), wherein the modular photovoltaic solar inverter (1) in turn comprises: a plurality of power modules (2), each of which comprises a power cell (6) and a filtering module (3). The modular photovoltaic solar inverter (1) further comprises a cooling module (4) and a transformer module (5).

The container (10), comprising a first and a second sealed compartment preferably with an IP54/IP65 protection level separating the power modules (2) from the transformer module (5), is configured to protect the modules (2, 3, 4, 5) from rain and high and low temperatures (typically between −35° C. and 60° C.). Additionally, the container (10) comprises a plurality of doors to allow temporary access to the different modules (2, 3, 4, 5), support structures configured to horizontally support and guide the power modules (2), and first and second hooks to enable the coupling of an extraction module (12).

Specifically, the plurality of power modules (2) are configured for forming groups (17) of two power modules (2), each group comprises the filtering module (3) and two power cells (6), which are configured to convert direct current (DC) from photovoltaic panels to a modulated (PWM) alternating current (AC). More specifically, the two power cells (6) are facing each other, and electrically linked in parallel to the next power module (2). Thus, each group (17) of two power modules (2) is electrically linked in parallel to each other group (17) of two power modules (2), as shown in FIG. 2.

Figure 2:
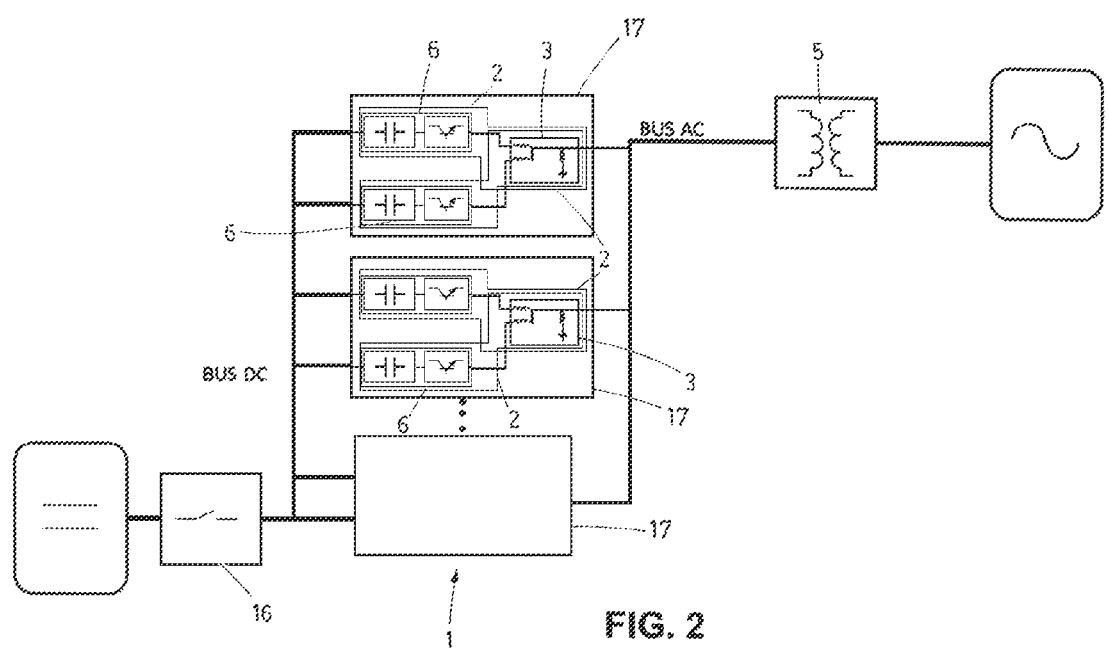
FIG. 2 shows a schematic view of the modular photovoltaic solar inverter of the present invention.
Figure 3:
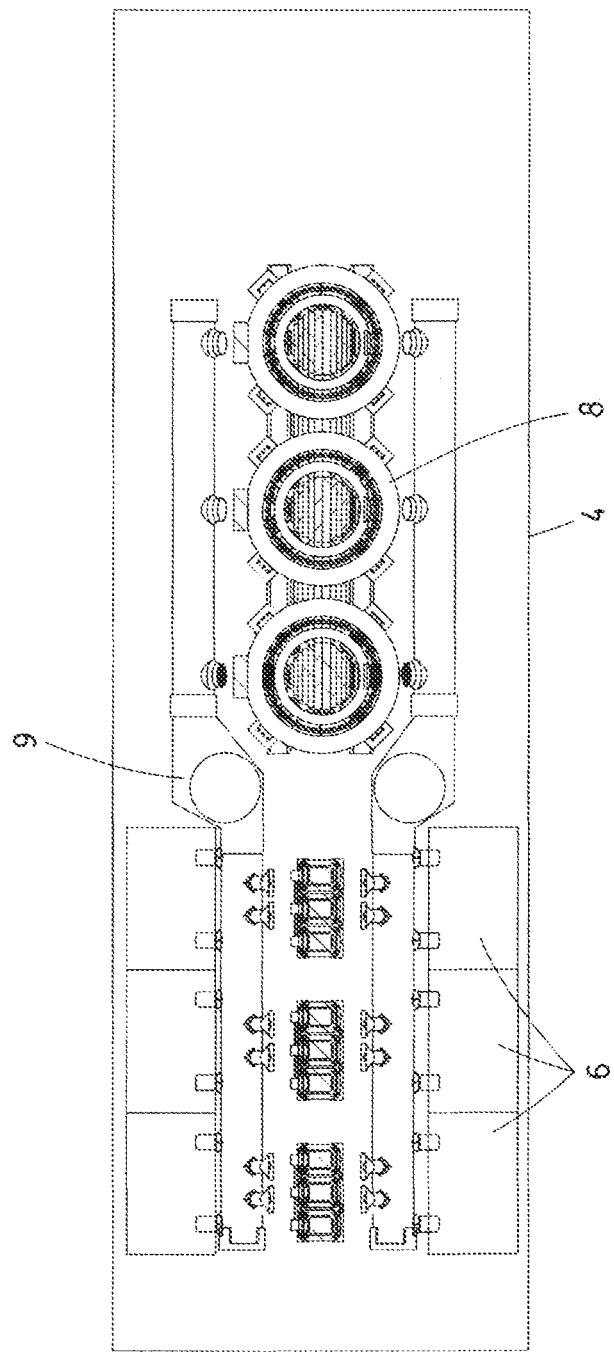
FIG. 3 shows a perspective view of the modular photovoltaic solar inverter of the present invention.

Further, as shown in FIG. 2, a DC bus connects all the inputs of the power modules (2) to a photovoltaic field through a connection/disconnection device (16).

Additionally, as shown in FIGS. 4A, 4B, 4C and 4D, each power inverter (6) comprises two input plates (7A) configured to connect to the DC bus produced by the photovoltaic panels and three output plates (7B) connected to the AC bus. Each power cell (6) on the side thereof also comprises a groove configured to be coupled to the support structures of the container (10) and in case of extraction/introduction with guide elements, each power cell (6) thus being installable and removable in an assisted manner by these elements and therefore feasible by a single operator.

Preferably, these plates (7A, 7B) are configured to be removably linked to the power module (2), for example by means of the use of screws, without the need for any other electrical connection or mechanical fastening.

Furthermore, the filtering module (3) is an LLC filter comprising:
- a first inductance for each output phase of each power module, wherein the first inductances of each group of two power modules (2) are coupled together in their respective phases,
- a capacitor connected in parallel to the first inductances, and
- a second inductance linked in series to the capacitor.

Preferably, the input of the transformer module (5) is linked to the output of the LLC filter and the output of the transformer module (5) is configured to connect to the electrical network.

Moreover, the cooling module (4), as shown in FIGS. 3 and 4A, 4B, 4C and 4D, is configured to reduce the temperature of the power modules (2) and the transformer module (5) and comprises a first and a second ventilation circuit that are independent from each other, and wherein each of them comprises:
- a centrifugal fan (8) configured to drive pre-filtered air from the base of the container (10),
- at least one channel (9), installed in the base of the compartment and linked to the centrifugal fan (8) thereof,
- extraction slots (11), installed in the roof of the compartment that enable the pre-filtered air to circulate from the base of the compartment to the outside and cool the power modules (2) by means of the first circuit and the transformer module (5) by means of the second circuit.

Lastly, as shown in FIGS. 4A, 4B, 4C and 4D, the solar inverter comprises an extraction module (12) that can be coupled in a door of the container (10) that provides access to one of the power modules (2). Specifically, this extraction module (12) is configured so that a single operator can extract and replace the entire power cell (6), by coupling/uncoupling the plates (7A, 7B) when the power cell (6) is damaged. In this way, the time during which the solar inverter (1) is stopped for maintenance reasons is reduced.

More specifically, as shown in FIGS. 4A, 4B, 4C and 4D, the extraction module (12) comprises:
- a pulley system (15),
- a guide element (13) horizontally coupled to first hooks installed on the side of the door frame of the container (10) that provides access to the power cell (6), wherein once the guide element (13) is installed, it is aligned with the support structures configured to horizontally support and guide the power cell (6) to enable the horizontal extraction/insertion of the power cell (6), and
- a support element (14) that can be coupled to second hooks installed in the upper portion of the door frame of the container (10) that provides access to the power cell (6), wherein once installed it is linked to the pulley system (15) which in turn is linked to the power cell (6), enabling the power cell (6) to be removed or installed to be vertically moved by a single operator.

Figure 4A:
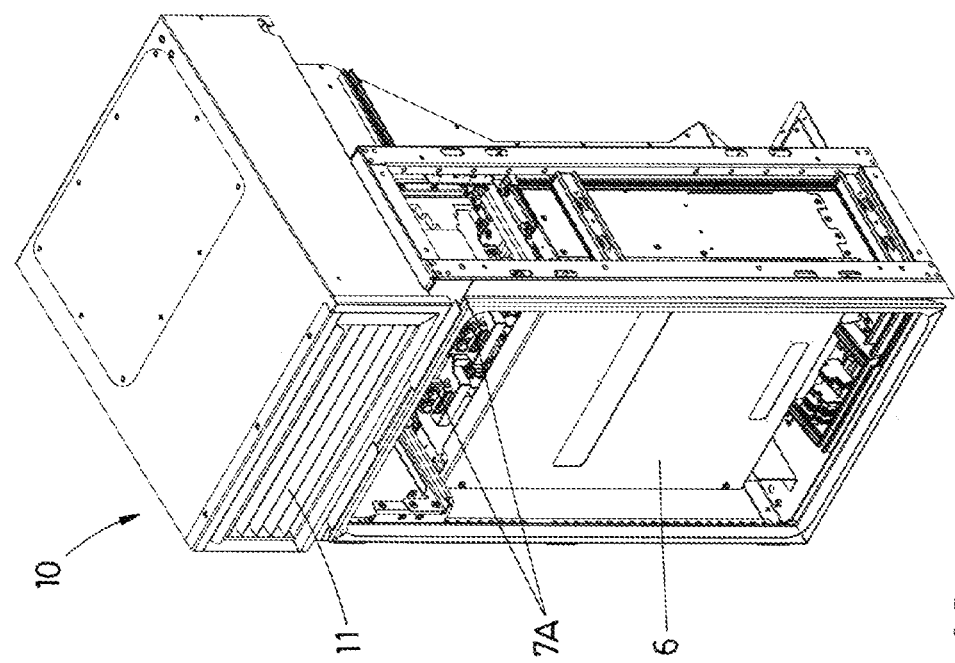
Figure 4A:
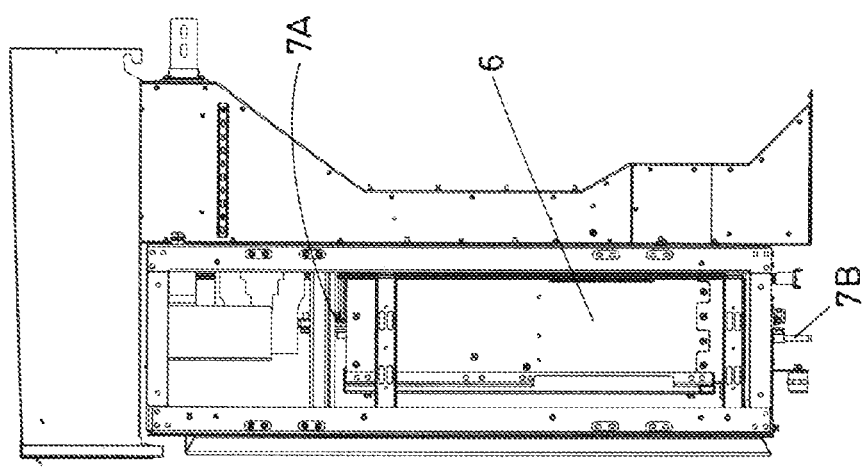
Figure 4C:
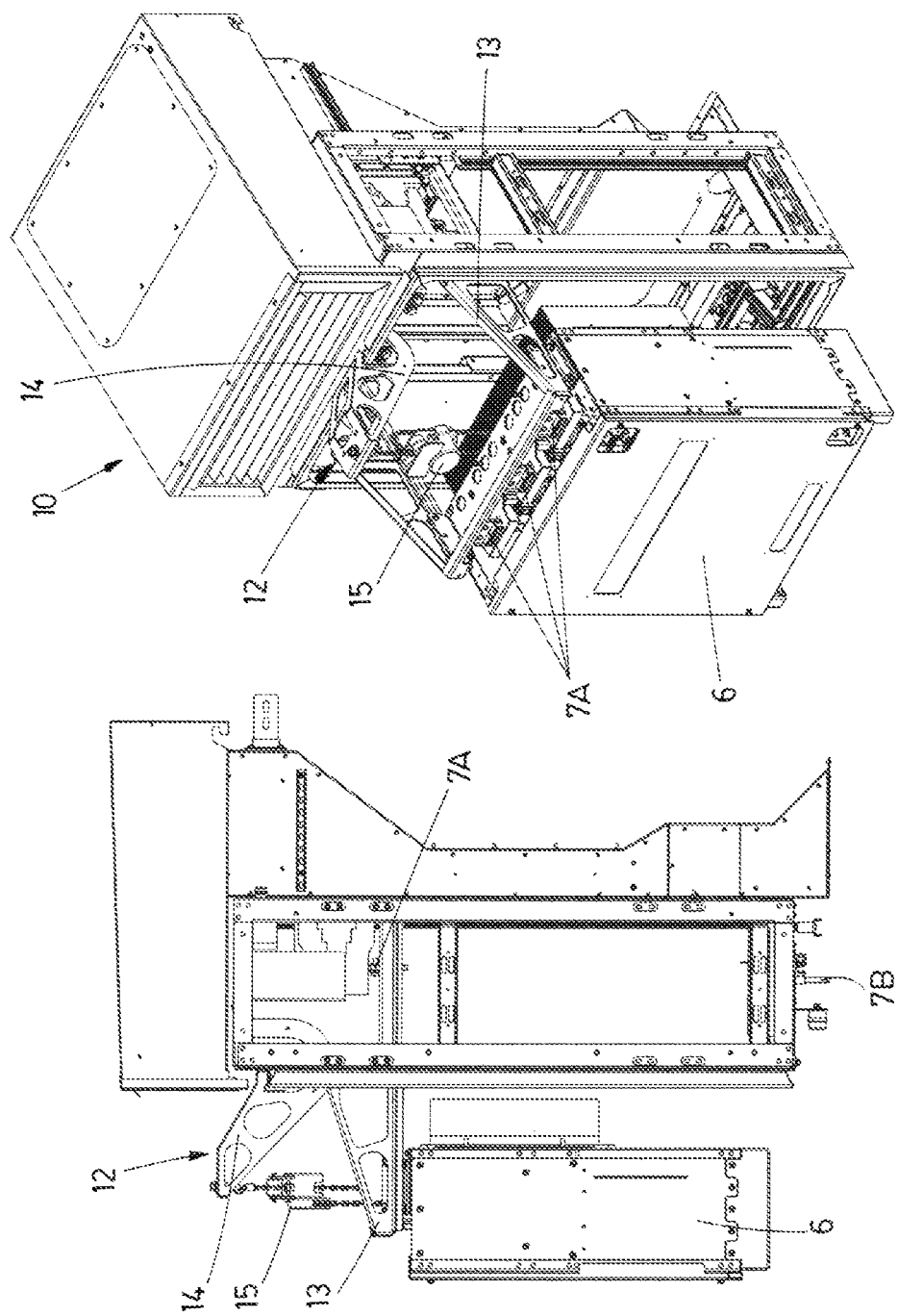
Figure 4D:
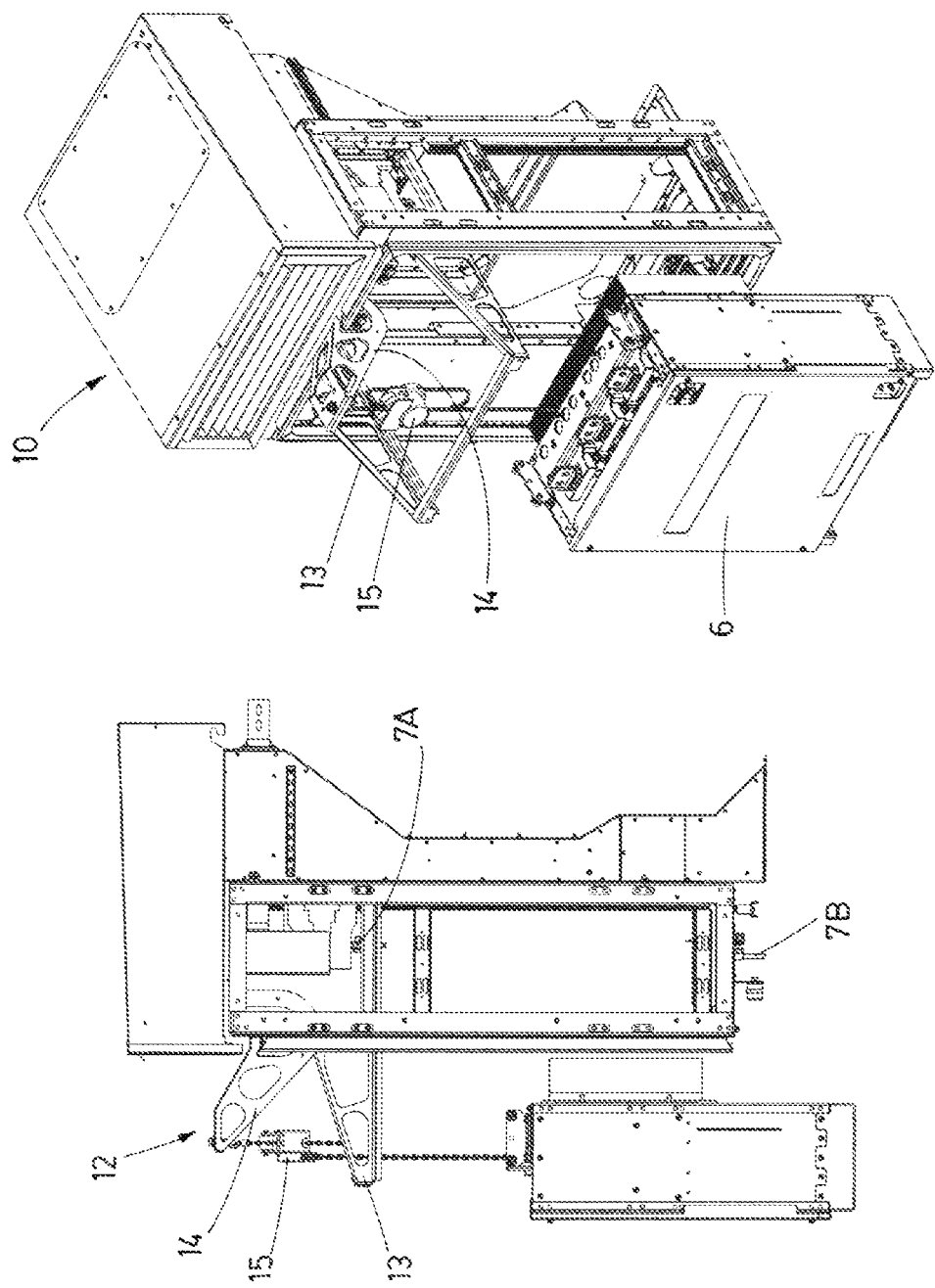

By way of example, as shown in FIGS. 4A, 4B, 4C and 4D, in order to change a power cell (6), the following steps are followed:
a) open the door of the container (10) that provides access to the power cell (6),
b) disconnect the plates (7A, 7B),
c) place the guide element (13) on the side of the door frame, such that it is aligned with the support structures,
d) place the support element (14) in the upper portion of the door frame,
e) extract the entire power cell (6) horizontally following first the support structures and then the guide element (13) as shown in FIG. 4D,
f) link the pulley system (15) to the power cell (6) and the support element (14),
g) vertically move, by means of the pulley system (15), the power cell (6) until it is resting on the ground, as shown in FIG. 4G,
h) replace the power cell (6), and
i) repeat the previous steps in reverse to install the new power cell (6).

It must be noted that, due to the high weight of each power cell (6), once they have been positioned on the ground they must be moved with a hydraulic forklift or similar means. Despite this, the extraction module (12) enables the entire process to be carried out by a single operator.

The invention claimed is:

1. A modular photovoltaic solar inverter comprising:
a plurality of power modules that convert a direct current (DC) to an alternating current (AC),
a DC bus that connects all the inputs of the power modules to a photovoltaic field through a connection/disconnection device, wherein each power module in turn comprises a power cell and a filtering module linked to an output of the power cell to adapt the electrical characteristics of the alternating current (AC),
an alternating current (AC) bus that connects the output of each power module to an electrical network,
wherein the power modules are configured to form groups of two power modules facing each other, and each group of two power modules is electrically linked in parallel to the other groups of two power modules,
wherein the filtering module is an LLC filter comprising:
a first inductance for each output phase of each power module, wherein the first inductances of each group of two power modules are coupled together in their respective phases,
a capacitor connected in parallel to the first inductances, and
a second inductance linked in series to the capacitor.

\* \* \* \* \*